United States Patent
Suzuki et al.

(10) Patent No.: US 8,520,772 B2
(45) Date of Patent: Aug. 27, 2013

(54) COMMUNICATION DEVICE AND POWER CORRECTION METHOD

(75) Inventors: Kenji Suzuki, Kawasaki (JP); Michiko Satou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 293 days.

(21) Appl. No.: 13/039,765

(22) Filed: Mar. 3, 2011

(65) Prior Publication Data

US 2011/0222630 A1    Sep. 15, 2011

(30) Foreign Application Priority Data

Mar. 10, 2010  (JP) .................................. 2010-52534

(51) Int. Cl.
*H04K 1/02* (2006.01)
(52) U.S. Cl.
USPC ............................................. 375/297
(58) Field of Classification Search
None
See application file for complete search history.

(56) References Cited

U.S. PATENT DOCUMENTS

| | | | |
|---|---|---|---|
| 7,443,923 B2 | 10/2008 | Shako et al. | |
| 2001/0007435 A1 | 7/2001 | Ode et al. | |
| 2003/0053552 A1* | 3/2003 | Hongo et al. | 375/295 |
| 2004/0116083 A1 | 6/2004 | Suzuki et al. | |
| 2005/0226346 A1* | 10/2005 | Ode et al. | 375/296 |
| 2006/0215783 A1* | 9/2006 | Shako et al. | 375/296 |
| 2007/0200625 A1 | 8/2007 | Shako et al. | |

FOREIGN PATENT DOCUMENTS

| | | |
|---|---|---|
| EP | 1 560 346 | 8/2005 |
| EP | 1 732 207 | 12/2006 |
| GB | 2 293 509 | 3/1996 |
| JP | 2002-159088 | 5/2002 |
| JP | 2004-320185 | 11/2004 |
| JP | 2005-65211 | 3/2005 |
| JP | 2007-221245 | 8/2007 |

OTHER PUBLICATIONS

European Search Report dated Jul. 5, 2011, from corresponding European Application No. 11 15 6731.

\* cited by examiner

*Primary Examiner* — Leon-Viet Nguyen
(74) *Attorney, Agent, or Firm* — Katten Muchin Rosenman LLP

(57) ABSTRACT

A communication device that compensates a distortion of a transmission signal, amplifies the compensated transmission signal by an amplifier, and outputs the signal. The device includes a storage unit that stores a transmission characteristic of a transmission power of the communication device, a correcting unit that calculates a power value at a set transmission frequency by referring to the storage unit and that corrects a feedback signal of the transmission signal amplifier by the amplifier based on the calculated power value and a maximum transmission power defined by the communication device, and a calculating unit that calculates a distortion compensation coefficient based on the transmission signal and the feedback signal corrected.

6 Claims, 8 Drawing Sheets

COMMUNICATION DEVICE AND POWER CORRECTION METHOD

CROSS-REFERENCE TO RELATED APPLICATIONS

This application is based upon and claims the benefit of priority of the prior Japanese Patent Application No. 2010-52534, filed on Mar. 10, 2010, the entire contents of which are incorporated herein by reference.

FIELD

The present application relates to a communication device that conducts a distortion compensation process on distortion characteristics of an amplifier that amplifies transmission signals, and to a power correction method for the communication device.

BACKGROUND

Recently, high efficiency transmission through digitalization has become widely used in wireless communication. For this type of high efficiency transmission, techniques to linearize power amplifier amplification characteristics to suppress non-linear distortion and reduce adjacent channel leakage power at transmission side devices such as base stations are important.

A pre-distortion method is known as one such distortion compensation method (see, for example, Japanese Laid-open Patent Publication No. 2005-65211 and Japanese Laid-open Patent Publication No. 2007-221245). In the pre-distortion method, a desired signal without distortion of the amplifier output is obtained by adding characteristics that are opposite the amplifier distortion characteristics to the amplifier input signal.

Specifically, the distortion compensation process based on the pre-distortion method involves comparing a transmission signal before the distortion compensation with a demodulated feedback signal, using the difference (power difference) from the comparison to calculate a distortion compensation coefficient, and then using the calculated distortion compensation coefficient to update the prior distortion compensation coefficient. The distortion compensation coefficient is stored in a memory by using transmission signal amplitude, power, or functions thereof as an address. Then, the transmission signal gain is adjusted to meet inverse characteristics of the distortion characteristics of the power amplifier by multiplying the updated distortion compensation coefficient by the next transmission signal to be sent. The gain adjusted transmission signal is then inputted into the power amplifier. By repeating this operation, finally the signals converge into an optimal distortion compensation coefficient and the distortion of the power amplifier is compensated.

Transmission frequencies (carrier frequencies) of wireless communication devices have specific bands for accommodating the various users who use wireless communication devices. Accordingly, a user can specify a desired transmission frequency in a wireless communication device according to the area and the like in which the user is using the wireless communication device.

SUMMARY

According to an aspect of the invention, a communication device that compensates a distortion of a transmission signal, amplifies the compensated transmission signal by an amplifier, and outputs the signal. The device includes a storage unit that stores a transmission characteristic of a transmission power of the communication device, a correcting unit that calculates a power value at a set transmission frequency by referring to the storage unit, and corrects a feedback signal of the transmission signal amplified by the amplifier based on the calculated power value and a maximum transmission power defined by the communication device, and a calculating unit that calculates a distortion compensation coefficient based on the transmission signal and the feedback signal corrected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Maximum transmission power is generally defined for wireless communication devices. Wireless communication devices are set to obtain the maximum transmission power from, for example, the center frequency of the available transmission frequency band. As a result, when a user specifies a transmission frequency other than the center frequency on a wireless communication device for example, the maximum transmission power of the set transmission frequency may not be able to be obtained.

In the following description, a first embodiment will be described in detail with reference to the drawings.

Figure 1:
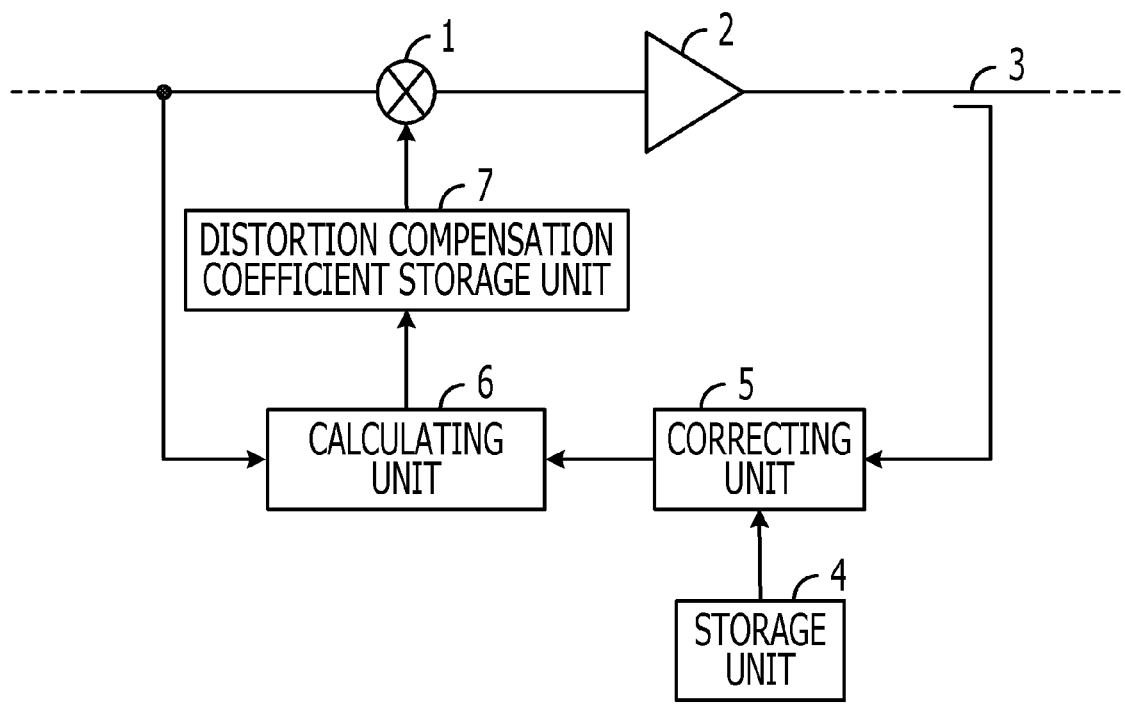
FIG. 1 is a block diagram of a communication device according to a first embodiment.

FIG. 1 is a block diagram of a communication device according to the first embodiment. As illustrated in FIG. 1, the communication device has a multiplier 1, an amplifier 2, a coupler 3, a storage unit 4, a correcting unit 5, a calculating unit 6, and a distortion compensation coefficient storage unit 7.

The multiplier 1 multiplies a distortion compensation coefficient in the distortion compensation coefficient storage unit 7 by a transmission signal.

The amplifier 2 amplifies the transmission signal multiplied by the distortion compensation coefficient. The amplified transmission signal is wirelessly transmitted through, for example, an antenna.

The coupler 3 outputs a part of the transmission signal amplified by the amplifier 2 to the correcting unit 5 as a feedback signal.

The storage unit 4 stores frequency characteristics of the transmission power of the communication device. For example, the communication device has transmission frequency bands allowing communication to accommodate various transmission frequencies set by users, and the storage unit 4 stores the transmission power corresponding to multiple transmission frequencies of those transmission frequency bands. The multiple transmission frequencies and the power corresponding to those transmission frequencies are, for example, measured before shipping from the factory where the communication device is manufactured, and stored in the storage unit 4.

The correcting unit 5 refers to the storage unit 4 and calculates the power of the transmission frequency set by a user. The correcting unit 5 corrects the feedback signal outputted from the coupler 3 to obtain the maximum transmission power at the transmission frequency set by the user based on the calculated power and the maximum transmission power defined by the communication device.

For example, the correcting unit 5 refers to the storing unit 4 and corrects the feedback signal based on the difference between the calculated transmission power of the transmission frequency set by the user and the maximum transmission frequency defined by the communication device to obtain the maximum transmission power of the transmission frequency set by the user. As a result, if, for example, the maximum transmission power and the transmission power of the transmission frequency set by the user are different, the distortion compensation coefficient is corrected so that the transmission power of the transmission frequency set by the user approaches the maximum transmission power.

The calculating unit 6 calculates the distortion compensation coefficient based on the transmission signal inputted into the multiplier 1 and the feedback signal of the transmission signal transmitted via the coupler 3.

The distortion compensation coefficient storage unit 7 stores the distortion compensation coefficient calculated by the calculating unit 6.

In this way, the correcting unit 5 of the communication device refers to the storage unit 4 storing the transmission power frequency characteristics and calculates the power of the transmission frequency set by the user. The correcting unit 5 then corrects the feedback signal to obtain the maximum transmission frequency of the transmission frequency set by the user based on the calculated power and the maximum transmission power defined by the communication device. As a result, the maximum transmission power for the transmission frequency set by the user can be obtained.

Next, a second embodiment will be described in detail with reference to the drawings.

Figure 2:
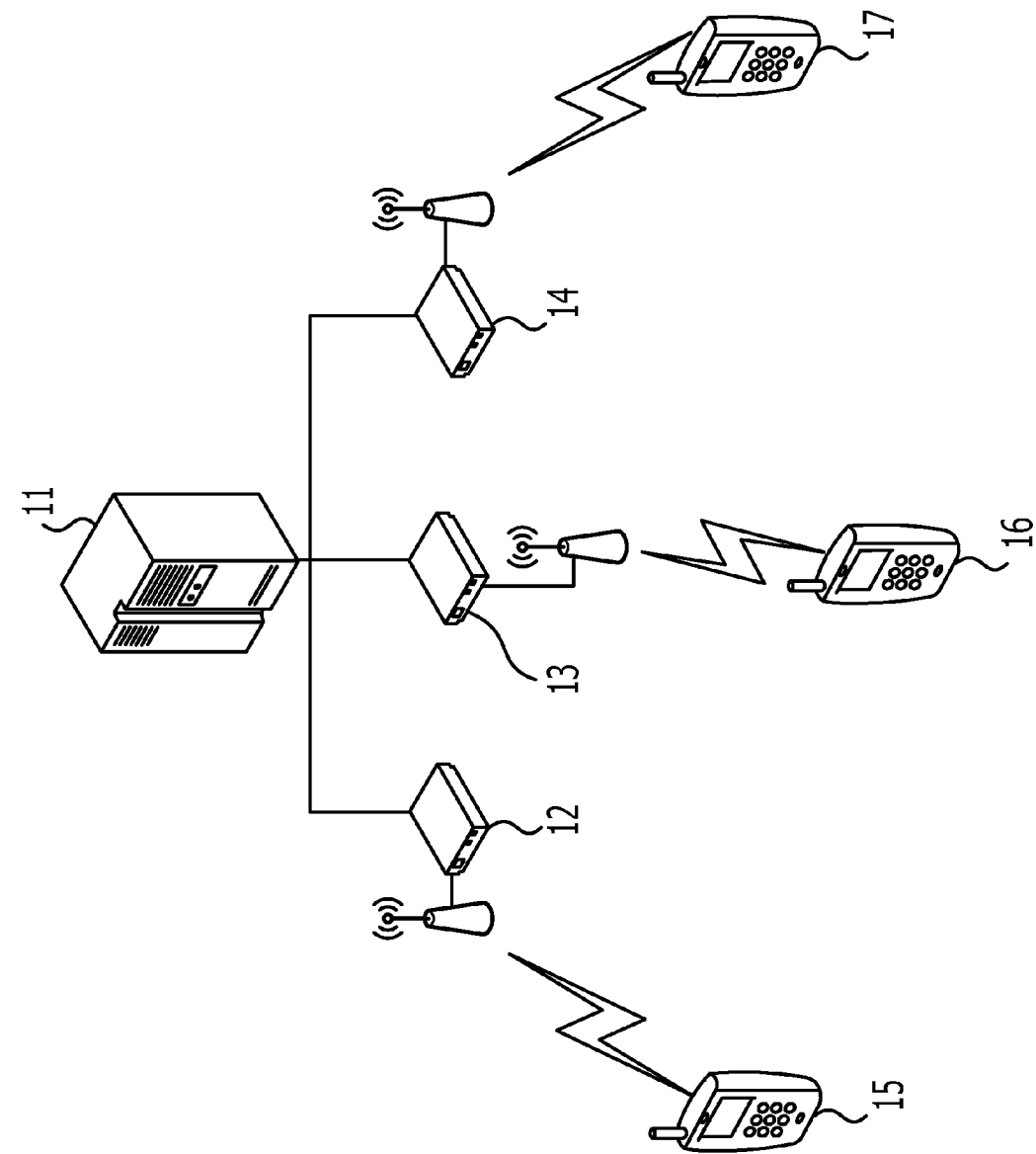
FIG. 2 is a diagram illustrating a communication system used by communication devices according to a second embodiment.

FIG. 2 is a diagram illustrating a communication system used by communication devices according to the second embodiment. The communication system illustrated in FIG. 2 is, for example, a mobile Worldwide Interoperability for Microwave Access (WiMAX) system using a Time Division Duplex (TDD) method in which transmission zones and reception zones are mutually repeated in the same frequencies. The communication system may also be a Long Term Evolution (LTE) system.

The communication system has an access gateway (AGW) 11, communication devices 12 to 14, and mobile stations (MS) 15 to 17. The communication devices 12 to 14 are, for example, base stations. Wireless signals are sent and received between the communication devices 12 to 14 and the mobile stations 15 to 17. The AGW 11 controls the communication devices 12 to 14.

Figure 3:
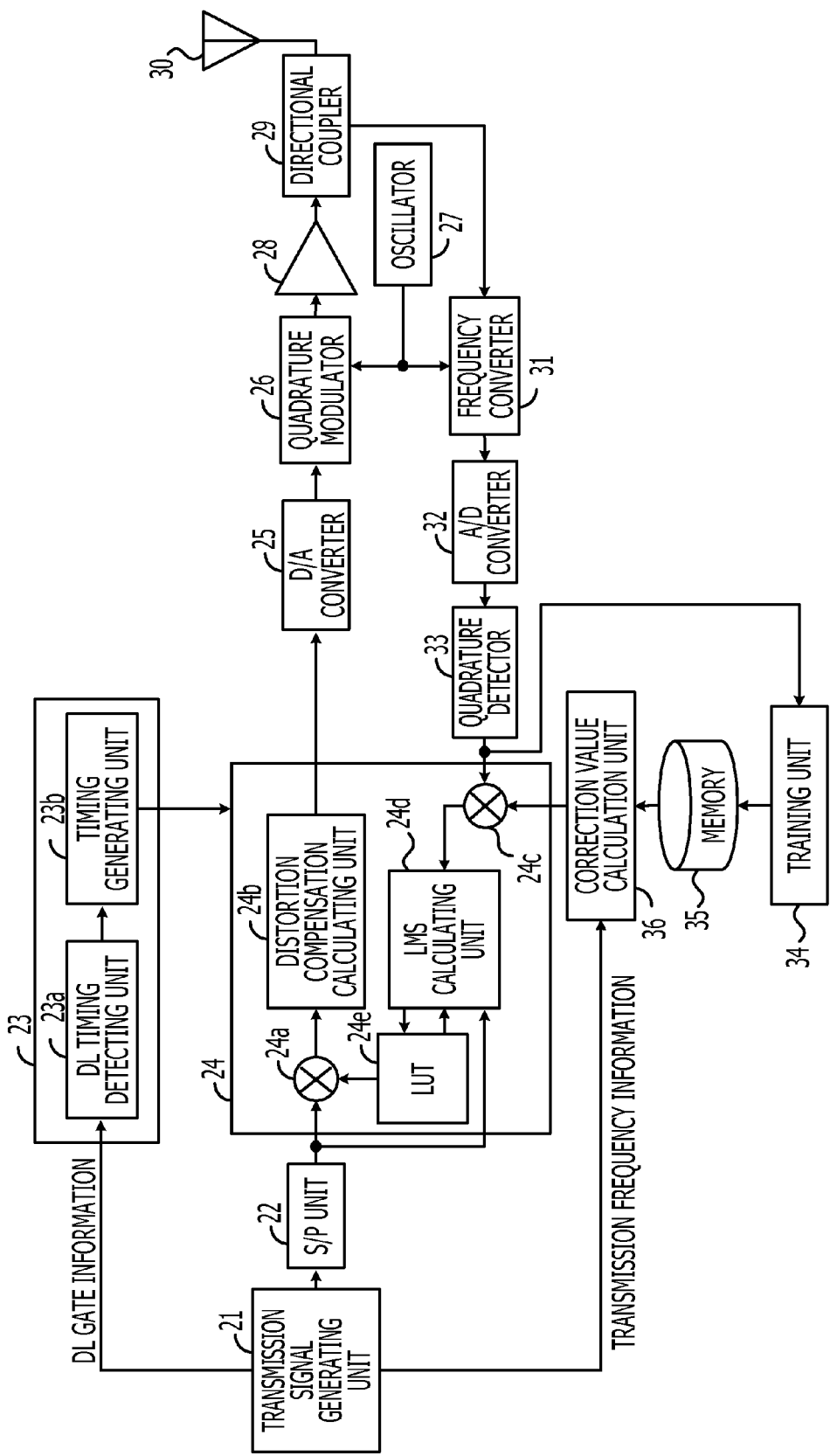
FIG. 3 is a block diagram of a communication device.

FIG. 3 is a block diagram of a communication device. As illustrated in FIG. 3, the communication device has a transmission signal generating unit 21, a serial/parallel (S/P) unit 22, a timing controller 23, a distortion compensation unit 24, a digital/analog (D/A) converter 25, a quadrature modulator 26, an oscillator 27, an amplifier 28, a directional coupler 29, an antenna 30, a frequency converter 31, an analog/digital (A/D) converter 32, a quadrature detector 33, a training unit 34, a memory 35, and a correction value calculation unit 36.

The transmission signal generating unit 21 transmits serial digital data sequences to mobile stations. The transmission signal generating unit 21 outputs down link (DL) gate information to the timing controller 23. Also, the transmission signal generating unit 21, for example, outputs transmission frequency information containing profiles input by users to the correction value calculation unit 36. The transmission frequency information includes signal frequencies set in the communication device. Transmission frequencies set in the communication device may be heretofore called set frequencies.

The S/P unit 22 conducts serial/parallel conversion of the serial digital data sequences into in-phase and quadrature (IQ) signal parallel data sequences.

The timing controller 23 has a DL timing detecting unit 23a and a timing generating unit 23b. The DL timing detecting unit 23a detects the transmission timing of transmission signals from the DL gate information outputted by the transmission signal generating unit 21.

The timing generating unit 23b generates a distortion compensation process starting signal and a distortion compensation process stopping signal based on the transmission timing detected by the DL timing detecting unit 23a and from the switch timing between the transmission zone and the receiving zone, and then outputs the starting and stopping signals to the distortion compensation unit 24.

The distortion compensation unit 24 has a multiplier 24a and a multiplier 24c, a distortion compensation calculating unit 24b, a least mean square (LMS) calculating unit 24d, and a lookup table (LUT) 24e. The multiplier 24a multiplies the distortion compensation coefficient outputted by the LUT 24e by the transmission signals outputted by the S/P unit 22.

The distortion compensation calculating unit 24b conducts, for example, a distortion compensation process to remove a DC offset of the transmission signal and the like. The distortion compensation calculating unit 24b begins the distortion compensation process according to the distortion compensation process starting signal, and stops the distortion compensation process according to the distortion compensation process stopping signal.

The multiplier 24c receives the transmission signal feedback signal amplified by the amplifier 28. Further, the multiplier 24c receives a correction value outputted by the correction value calculation unit 36. The multiplier 24c multiplies the feedback signal by the correction value and outputs the result to the LMS calculating unit 24d.

The LMS calculating unit 24d updates the distortion compensation coefficient in the LUT 24e according to the differential between the corrected power of the feedback signal outputted from the multiplier 24c and the power of the transmission signal outputted from the S/P unit 22, based on LMS computing. The LMS calculating unit 24d generates a LUT 24e address to update the distortion compensation coefficient based on the power of the transmission signal outputted by the S/P unit 22. Also, the LMS calculating unit 24d generates a LUT 24e address for outputting the distortion compensation coefficient to the multiplier 24a based on the power of the transmission signal outputted by the S/P unit 22.

The LUT 24e is a memory that stores distortion compensation coefficients. The D/A converter 25 performs digital to analog conversion of the IQ signal undergoing the distortion compensation process by the distortion compensation unit 24. The quadrature modulator 26 mixes carrier waves that are 90 degrees out of phase with each other and outputted from the oscillator 27 with the I-signal and the Q-signal.

The amplifier 28 conducts power amplification of the transmission signal outputted from the quadrature modulator 26. The amplifier 28 is set, for example, to allow the output of the maximum transmission power at the center frequency of the transmission frequency band available to the communication device. The maximum transmission power is the maximum transmission power defined by the communication device.

The directional coupler 29 outputs, to the antenna 30, the transmission signal outputted by the amplifier 28, and also outputs a portion of the transmission signal to the frequency converter 31 as the feedback signal.

The frequency converter 31 converts the transmission signal outputted by the directional coupler 29 into an intermediate frequency (IF) signal based on the oscillation signal outputted by the oscillator 27. The A/D converter 32 conducts analog to digital conversion of the IF signal. The quadrature detector 33 separates the digitally converted IF signal into I-signal and Q-signal parallel data sequences and outputs the sequences to the distortion compensation unit 24.

The training unit 34 conducts power training for the transmission signal (feedback signal) at the predetermined transmission frequency, for example, before shipping the communication device from the factory. For example, the oscillator 27 sequentially generates predetermined multiple carrier waves of different frequencies, and the training unit 34 stores, in the memory 35, powers of the feedback signals outputted from the quadrature detector 33 for each frequency.

The memory 35 stores frequency characteristics of the transmission power of the communication device. For example, predetermined multiple transmission frequencies for power training and power values of transmission signals (feedback signals) for those frequencies are stored in the memory 35 in association with each other. These frequencies and power values are stored in the memory 35 before shipping from the factory where the communication device is made as described above.

The correction value calculation unit 36, for example, refers to the memory 35 and calculates the transmission signal power (pseudo transmission power) for set frequencies based on the set frequencies of the transmission frequency information outputted by the transmission signal generating unit 21 when the power source is turned on and data transmission begins.

Here, the communication device is able to conduct wireless communication at transmission frequencies of specific widths. The user specifies a desired transmission frequency among the transmission frequencies of specific widths in a profile. The correction value calculation unit 36 refers to the memory 35 to calculate the pseudo transmission power for the set frequency set by the user.

The correction value calculation unit 36 calculates the difference between the calculated pseudo transmission power and the maximum transmission power stored in the memory 35. The correction value calculation unit 36 outputs the calculated difference to the multiplier 24c. As a result, the power of the feedback signal is corrected by the multiplier 24c according to the difference between the maximum transmission power and the transmission power for the set frequency set by the user. In other words, the multiplier 24c corrects the feedback signal so that the maximum transmission signal of the communication device can be obtained for the set frequency set by the user.

Figure 4:
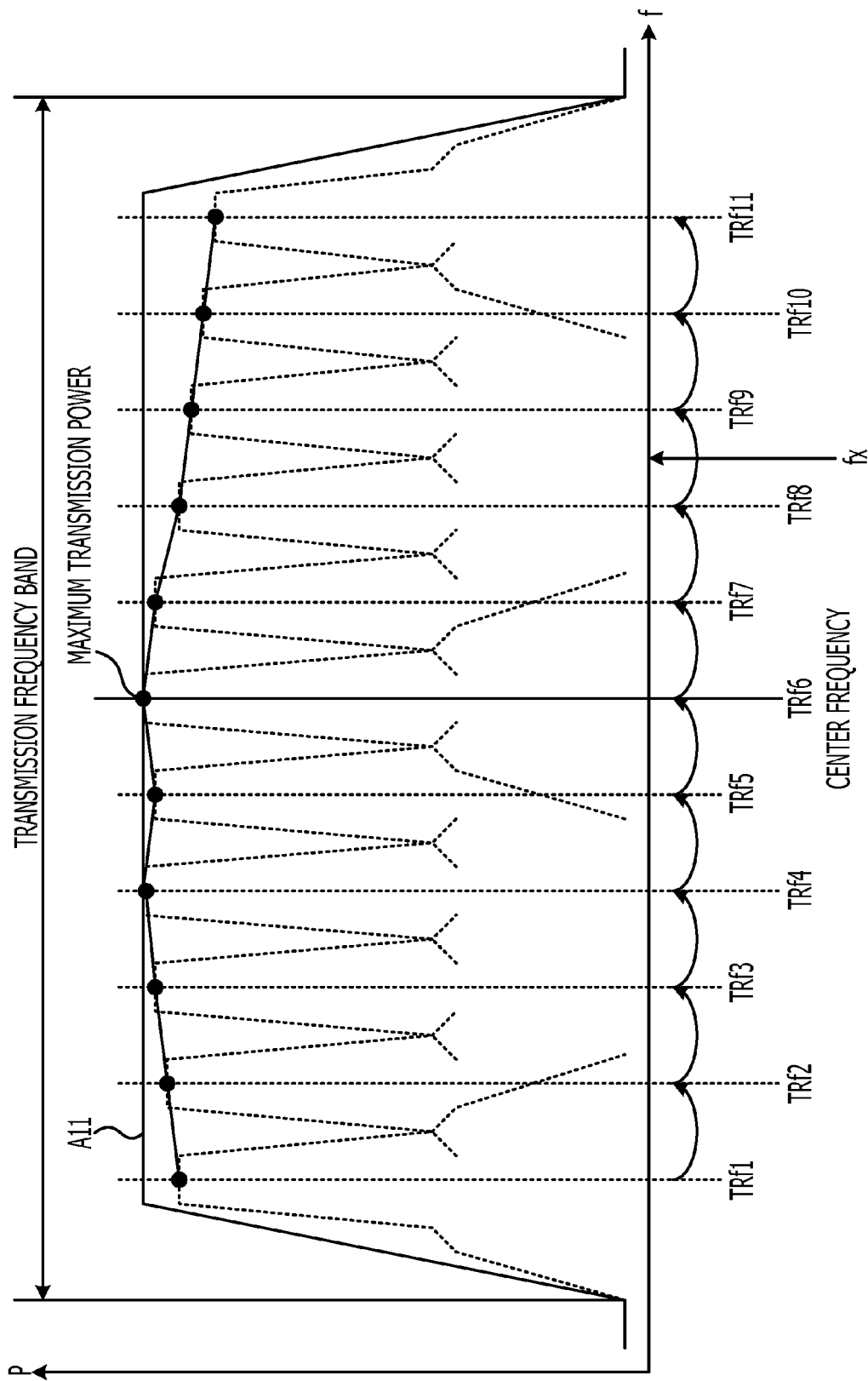
FIG. 4 is a diagram describing transmission power training.

FIG. 4 is a diagram describing transmission power training. FIG. 4 is a graph indicating frequency on the horizontal axis and power on the vertical axis. The dots in FIG. 4 indicate actual transmission power (power of the feedback signal outputted from the quadrature detector 33) of the communication device for the transmission frequencies. Also, waveform A11 in FIG. 4 indicates an ideal transmission power of the communication device.

The training unit 34 measures the transmission power of the transmission signals (feedback signals) at the transmission frequencies TRf1 to TRf11 which are predetermined before, for example, shipping from the factory where the communication device is made. The training unit 34 stores each of the transmission frequencies TRf1 to TRf11 in the memory 35 in association with the measured transmission power.

More specifically, the training unit 34 sets the power amplification of the amplifier 28 to obtain the defined maximum transmission power and causes the oscillator 27 to sweep the transmission frequencies from the lowest transmission frequency band to the highest band. The training unit 34 acquires the transmission power values of the predetermined transmission frequencies TRf1 to TRf11 and records the values in the memory 35. In the example in FIG. 4, the transmission power reaches the maximum level at the center frequency (TRf6) of the transmission frequency bands available for transmission.

The transmission frequencies for power training cover the entire transmission frequency band available for the communication device. Also, the transmission frequencies for power training evenly divide the transmission frequency band available for the communication device.

As indicated by the waveform A11, the maximum transmission power of the transmission signals is preferably fixed for the available transmission frequencies. However, actually, the maximum transmission power differs according to the transmission frequency as indicated by the dots in FIG. 4. As a result, when, for example, a user specifies a transmission frequency fx as illustrated in FIG. 4, the actual maximum transmission power defined by the communication device is different.

Figure 5:
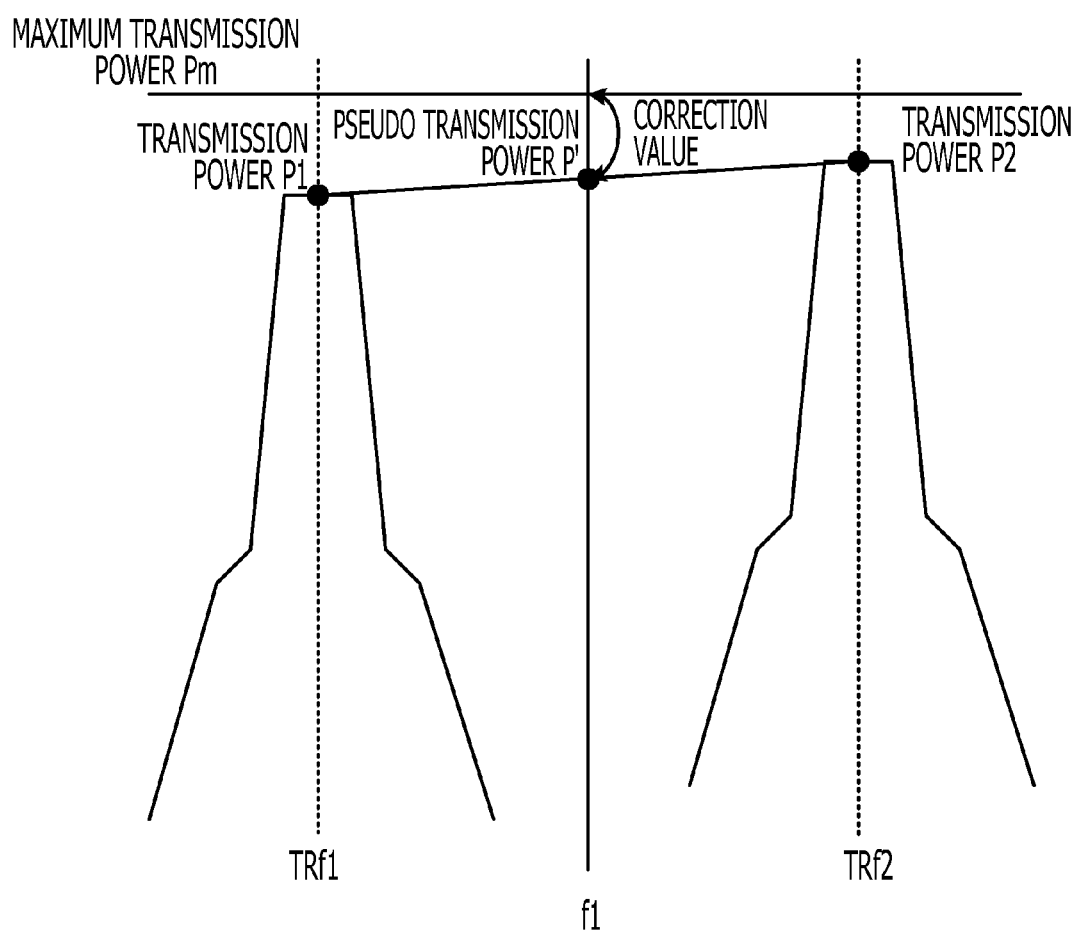
FIG. 5 is a diagram describing a correction value calculation.

FIG. 5 is a diagram describing a correction value calculation. FIG. 5 illustrates transmission power P1 and transmission power P2 of the transmission frequencies TRf1 and TRf2 illustrated in FIG. 4. FIG. 5 also illustrates the maximum transmission power Pm illustrated in FIG. 4 of the communication device. As described above, the transmission powers P1 and P2 and the maximum transmission power Pm are stored in the memory 35 based on the power training conducted before shipping.

The correction value calculation unit 36 outputs a correction value to correct the feedback signal outputted by the quadrature detector 33 when, for example, the communication device is shipped to a user and the power is turned on. The correction value is a value to correct even the user set frequency to obtain the maximum transmission power Pm of the transmission signal.

For example, after turning the power on, the transmission frequency information including a set frequency f1 is outputted from the transmission signal generating unit 21. In this case, the correction value calculation unit 36 calculates a pseudo transmission power P' for the set frequency f1 based on the power information stored in the memory 35. The correction value calculation unit 36 obtains the difference between the pseudo transmission power P' and the maximum transmission power Pm stored in the memory 35, and makes the obtained difference the correction value.

Specifically, the correction value calculation unit 36 acquires, from the memory 35, the transmission power P1 and P2 of the two transmission frequencies TRf1 and TRf2 close to the set transmission frequency f1 included in the transmission frequency information. The correction value calculation unit 36 conducts a linear approximation of the transmission power from the obtained transmission powers P1 and P2, and calculates the pseudo transmission power P' for the set frequency f1. The correction value calculation unit 36 subtracts the pseudo transmission power P' from the maximum transmission power Pm stored in the memory 35 to obtain the correction value.

The following equations 1 and 2 are used to calculate the pseudo transmission power P' and the correction value R.

$$P'=\{(P2-P1)/(TRf2-TRf1)\}\times(f1-TRf1)+P1 \quad \text{Equation 1}$$

$$R=Pm-P' \quad \text{Equation 2}$$

The correction value calculation unit 36 outputs the calculated correction value to the multiplier 24c. The multiplier 24c multiplies the correction value by the feedback signal outputted by the quadrature detector 33. As a result, the feedback signal with the power corrected is outputted by the multiplier 24c.

If the frequency set by the user and the frequency stored in the memory 35 match, the correction value calculation unit 36 makes the matching frequency power the pseudo transmission power.

Figure 6:
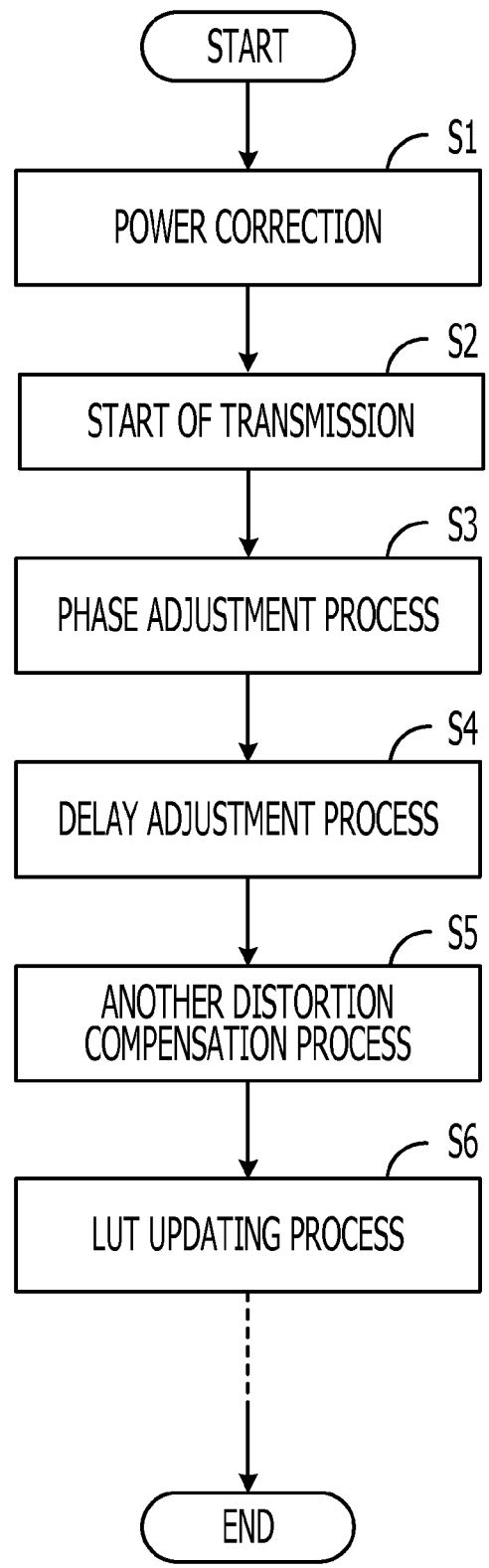
FIG. 6 is a flowchart illustrating a distortion compensation process of a communication device.

FIG. 6 is a flowchart illustrating a communication device distortion compensation process. In the following description, the communication device undergoes power training, for example, at the factory before shipping, and transmission powers for specific transmission frequencies are stored in the memory 35.

(Step S1) The transmission signal generating unit 21 outputs the transmission frequency information of a profile inputted by the user to the correction value calculation unit 36 when, for example, the communication device power is turned on. The correction value calculation unit 36 refers to the memory 35 and calculates the pseudo transmission power of the set frequency included in the transmission frequency information.

The correction value calculation unit 36 calculates the correction value for the set frequency when calculating the pseudo transmission power. In other words, the correction value calculation unit 36 calculates the correction value for obtaining the maximum transmission power for the set frequency. The correction value calculation unit 36 outputs the calculated correction value to the multiplier 24c.

(Step S2) The communication device starts transmitting user data. The transmission signal generating unit 21 outputs the user data to the S/P unit 22.

(Step S3) The communication device conducts a phase adjustment process. For example, the phase adjustment process is conducted to match the phases of the feedback signal and the transmission signal sent to the LMS calculating unit 24d.

(Step S4) The communication device conducts a delay adjustment process. For example, the delay adjustment process is conducted to match the timing of the feedback signal and the transmission signal inputted into the LMS calculating unit 24d.

(Step S5) The communication device conducts another distortion compensation process. For example, the communication device conducts a process to remove the DC offset and the like.

(Step S6) The LMS calculating unit 24d updates the LUT 24e. As a result, the multiplier 24a multiplies the transmission signal by the distortion compensation coefficient based on the power corrected feedback signal. The communication device then repeats the processes of steps S3 to S6.

In this way, the correction value calculation unit 36 refers to the memory 35 that stores the frequency characteristics of the transmission power and calculates the power of the transmission frequency set by the user, and then calculates the correction value based on the calculated power and the maximum transmission power defined by the communication device. The multiplier 24c multiplies the correction value calculated by the correction value calculation unit 36 by the feedback signal. As a result, the maximum transmission power for the transmission frequency set by the user can be obtained.

Further, the correction value calculation unit 36 refers to the memory 35 to acquire the power corresponding to two frequencies close to the transmission frequency set by the user, and then calculates the power at the transmission frequency set by the user from the linear approximation of the acquired power. The correction value calculation unit 36 then calculates the difference between the calculated power and the maximum transmission power defined by the communication device. As a result, the communication device can accurately obtain the power at the transmission frequency set by the user and accurately obtain the maximum transmission power at the transmission frequency set by the user.

Furthermore, the power corresponding to the frequencies evenly divided in the frequency band available for the communication device are stored in the memory 35. As a result, the communication device can accurately obtain the power level for the transmission frequency set by the user and accurately obtain the maximum transmission power at the transmission frequency set by the user.

Herein, a third embodiment will be described in detail with reference to the drawings. In the second embodiment, the LUT updating process and a specific process are conducted after the power correcting process as described in FIG. 6. As a result, until the LUT updating process is conducted just after beginning transmission of the user data, the power correction is not reflected in the user data. In the third embodiment, the transmission power data is made to be reflected in the user data just after beginning transmission of the user data.

Figure 7:
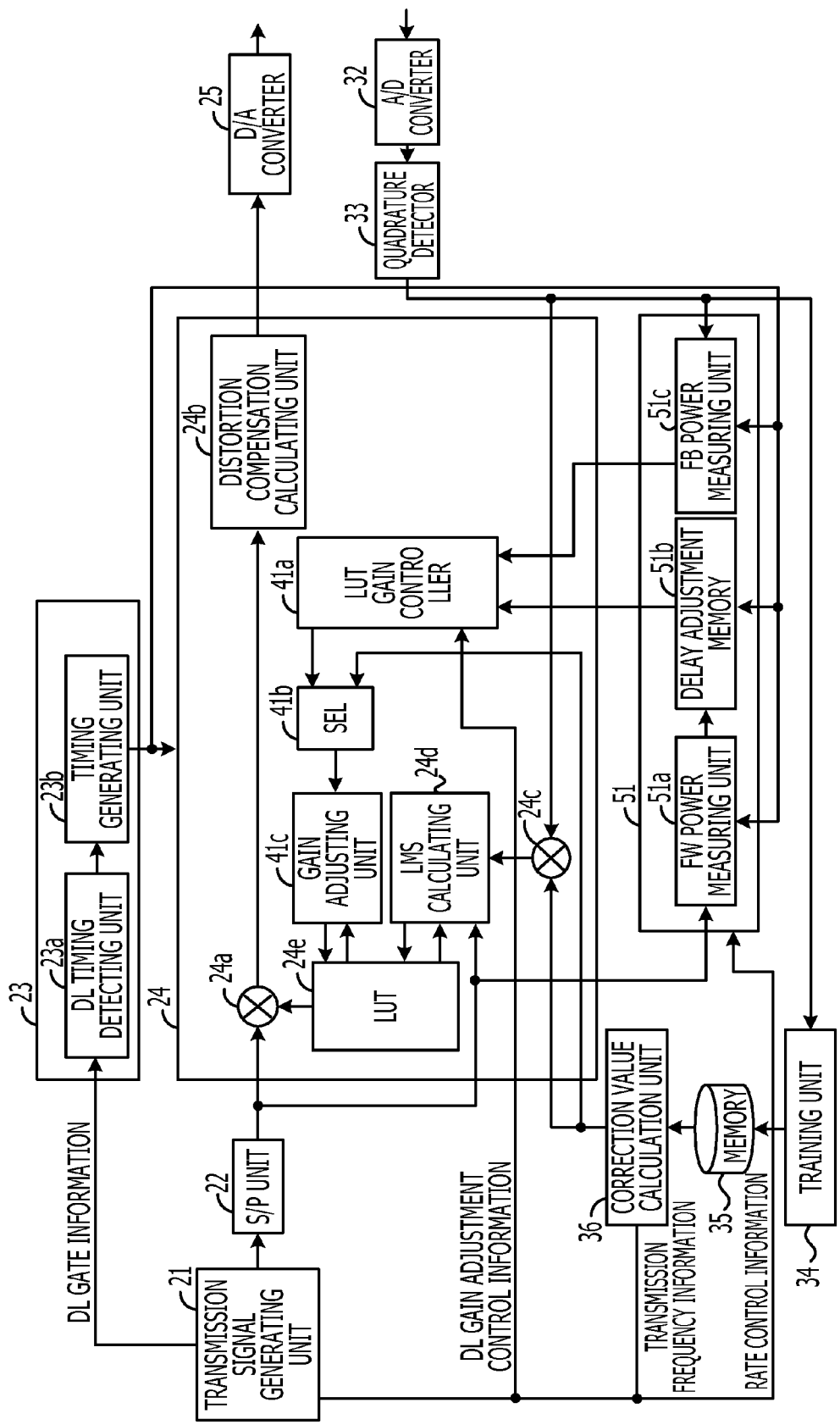
FIG. 7 is a block diagram of a communication device according to a third embodiment.

FIG. 7 is a block diagram of the communication device according to the third embodiment. In FIG. 7, the same configurations as in FIG. 3 are assigned the same reference numerals and thus the description is omitted. The quadrature modulator 26, the oscillator 27, the amplifier 28, the directional coupler 29, the antenna 30, and the frequency converter 31 in FIG. 3 are omitted in FIG. 7.

The distortion compensation unit 24 of the communication device in FIG. 7 has a LUT gain controller 41a, a selector (SEL) 41b, and a gain adjusting unit 41c. The communication device also has a power measuring unit 51. The power measuring unit 51 has a forward (FW) power measuring unit 51a, a delay adjustment memory 51b, and a feedback (FB) power measuring unit 51c.

The LUT gain controller 41a calculates a gain adjustment value for correcting the distortion compensation coefficient based on a power value measured by the power measuring unit 51.

The SEL 41b receives the power correction value calculated by the correction value calculation unit 36, and the gain adjustment value calculated by the LUT gain controller 41a. The SEL 41b, for example, outputs the correction value calculated by the correction value calculation unit 36 to the gain adjusting unit 41c after the power of the communication device is turned on, and outputs the gain adjustment value calculated by the LUT gain controller 41a after the power is turned on and after the LUT 24e LUT updating process is conducted.

The gain adjusting unit 41c corrects the distortion compensation coefficient stored in the LUT 24e based on the gain adjustment value or the correction value outputted by the SEL 41b. For example, the gain adjusting unit 41c multiplies the gain adjustment value or the correction value outputted by the SEL 41b by the distortion compensation coefficient stored in the LUT 24e and adjusts the distortion compensation coefficient (power value indicated by a complex number) of the LUT 24e.

The FW power measuring unit 51a and the FB power measuring unit 51c receive rate control information from the transmission signal generating unit 21. The rate control information includes information specifying unit times for measuring power. For example, the rate control information includes information that specifies measuring the power in carrier units, symbol units, or frame units.

The FW power measuring unit 51a and the FB power measuring unit 51c measure the power values of the transmission signals (forward signals) and feedback signals at unit times specified by the transmission signal generating unit 21. When the unit time is carrier units, the power level of each 1 carrier for 1 symbol becomes the measured power level. Further, when the unit time is symbol units or frame units, an integrated value of each power level of multiple carriers in one symbol or in one frame becomes the measured power level.

The delay adjustment memory 51b is a memory for adjusting time deviation between a forward signal power measurement timing and a measurement timing of the feedback signal corresponding to the forward signal. The delay adjustment memory 51b delays the output timing of the measured forward signal measured power level to the LUT gain controlling unit 41a, and supplies the forward signal measured power value at the same timing as the output timing of the feedback signal measured power level, to the LUT gain controlling unit 41a.

The LUT gain controlling unit 41a obtains the measured power levels of the forward signal and the feedback signal from the delay adjustment memory 51b and the FB power measuring unit 51c, and calculates a gain adjustment value based on the ratio of the two obtained measured power levels. If the forward signal power from the transmission signal generating unit 21 fluctuates, the distortion compensation coefficient at the time of the fluctuation differs from the optimal value of the distortion compensation coefficient since the distortion compensation coefficient is not updated in response to the power fluctuation (due to deviation from the convergence state). As a result, distortion of the transmission signal occurs during amplification by the amplifier 28 and the difference between the feedback signal power and the transmission signal power increases. The LUT gain controller 41a obtains the power ratio of the forward signal and the feedback signal as a gain adjustment value based on the DL gain adjustment control information from the transmission signal generating unit 21, and outputs the gain adjustment value to the SEL 41b. The gain adjusting unit 41c multiplies the gain adjustment value outputted by the SEL 41b by the distortion compensation coefficient stored in the LUT 24e, and increases or decreases the power level indicated by the distortion compensation coefficient using the gain adjustment value.

Figure 8:
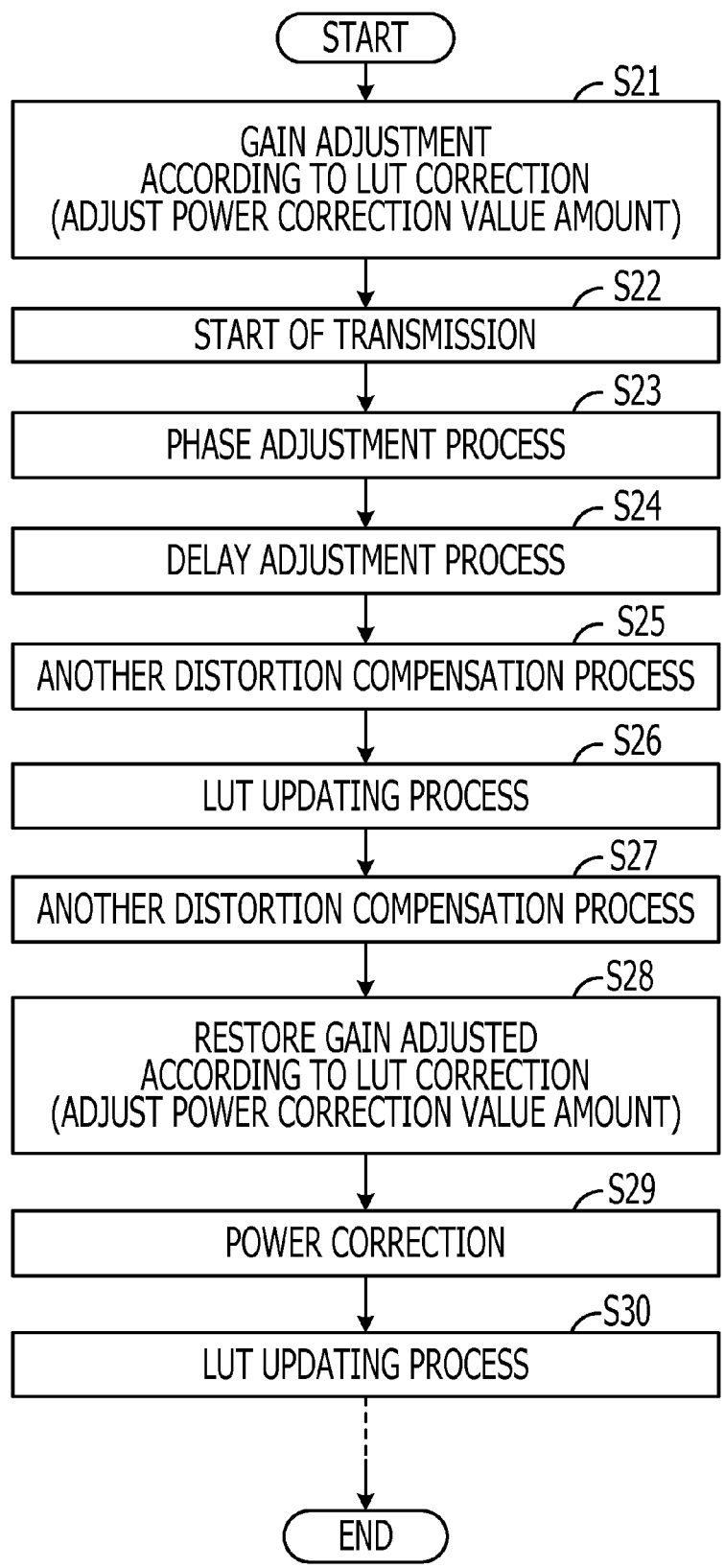
FIG. 8 is a flowchart illustrating a distortion compensation process of a communication device.

FIG. 8 is a flowchart illustrating a communication device distortion compensation process. In the following description, the communication device undergoes power training, for example, at the factory before shipping, and transmission powers for specific transmission frequencies are stored in the memory 35. Further, when the power is turned on, the LUT 24e stores the initial values for all the addresses. For example, the LUT 24e stores the distortion compensation coefficient of 1+j·0 so that the transmission signals inputted into the multiplier 24a are outputted as is.

(Step S21) The transmission signal generating unit 21 outputs the transmission frequency information of a profile inputted by the user to the correction value calculation unit 36 when, for example, the communication device power is turned on. The correction value calculation unit 36 refers to the memory 35 and calculates the pseudo transmission power of the set frequency included in the transmission frequency information.

The correction value calculation unit 36 calculates the power correction value for the set frequency when the pseudo transmission power is calculated. In other words, the correction value calculation unit 36 calculates the correction value for obtaining the maximum transmission power of the set frequency. The correction value calculation unit 36 outputs the calculated correction value to the SEL 41b.

The SEL 41b outputs the correction value calculated by the correction value calculation unit 36 to the gain adjusting unit 41c. Although the calculated correction value is outputted to the multiplier 24c, the multiplier 24c does not multiply the correction value by the feedback signal until the power correction step described below is executed.

The gain adjusting unit 41c multiplies the correction value outputted from the SEL 41b by the distortion compensation coefficient stored in the LUT 24e. Specifically, the gain adjusting unit 41c corrects the distortion compensation coefficient stored in the LUT 24e based on the correction value outputted by the SEL 41b. As a result, the distortion compensation coefficient (power value) is adjusted by the power correction value amount calculated by the correction value calculation unit 36.

(Step S22) The communication device begins sending the user data. The transmission signal generating unit 21 outputs the user data to the S/P unit 22. The distortion compensation coefficient of the LUT 24e is corrected by the power correction value calculated by the correction value calculation unit 36. As a result, after turning the power of the communication device on, the power corrected transmission signal is outputted from the multiplier 24a when the user data is outputted from the transmission signal generating unit 21.

(Step S23) The communication device conducts a phase adjustment process. For example, the phase adjustment process is conducted to match the phases of the feedback signal and the transmission signal inputted into the LMS calculating unit 24d.

(Step S24) The communication device conducts a delay adjustment process. For example, the delay adjustment process is conducted to match the timing of the feedback signal and the transmission signal inputted into the LMS calculating unit 24d.

(Step S25) The communication device conducts another distortion compensation process. For example, the communication device conducts a process to remove the DC offset and the like.

(Step S26) The LMS calculating unit 24d updates the LUT 24e.

(Step S27) The communication device conducts another distortion compensation process. For example, the communication device conducts the distortion compensation processes described in steps S23 to S25.

(Step S28) The gain adjusting unit 41c restores the distortion compensation coefficient with the correction value amount (power value amount adjusted by the distortion compensation coefficient) multiplied by the distortion compensation coefficient of the LUT 24e. As a result, the uncorrected distortion compensation coefficient which is updated in step S26 is stored in the LUT 24e.

The output of the SEL 41b is switched from the correction value of the correction value calculation unit 36 to the gain adjustment value of the LUT gain controlling unit 41a. As a result, the distortion compensation coefficient of the LUT 24e is gain adjusted based on the power difference between the forward signal measured by the power measuring unit 51 and the feedback signal.

(Step S29) The multiplier 24c outputs the feedback signal with the calculated correction value to the LMS calculating unit 24d.

(Step S30) The LMS calculating unit 24d updates the LUT 24e. As a result, the transmission signal is multiplied by the distortion compensation coefficient updated in the LUT 24e by the multiplier 24a. The communication device then repeats the processes of steps S23 to S26 and the LUT updating process.

In this way, the gain adjusting unit 41c multiplies the correction value calculated by the correction value calculation unit 36 by the distortion compensation coefficient of the LUT 24e before the transmission signal is transmitted after turning on the power of the communication device, and the distortion compensation coefficient of the LUT 24e is restored by the multiplied correction value amount after the distortion compensation coefficient of the LUT 24e is updated. Then, the multiplier 24c multiplies the correction value calculated by the correction value calculation unit 36 by the feedback signal after the distortion compensation coefficient of the LUT 24e is restored with the correction value amount by the gain adjusting unit 41c. As a result, power correction can be reflected in the user data immediately after beginning to transmit the user data.

The first to third embodiments have been described relating to a communication device that conducts wireless communication. However, a communication device that conducts communication with optical signals may also be applicable. For example, as illustrated in FIG. 3, a communication device that converts the D/A converted transmission signals to optical signals, amplifies and transmits the signals may be applicable.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A communication device that compensates a distortion of a transmission signal, amplifies the compensated transmission signal by an amplifier, and outputs the amplified signal, the device comprising:
    a storage unit that stores a transmission characteristic of a transmission power of the communication device;
    a correcting unit that calculates a power value at a set transmission frequency by referring to the storage unit, and corrects a feedback signal of the transmission signal amplified by the amplifier based on the calculated power value and a maximum transmission power defined by the communication device; and
    a calculating unit that calculates a distortion compensation coefficient based on the transmission signal and the feedback signal corrected, wherein:
    the correcting unit comprises
    a correction value calculation unit that obtains power values corresponding to two frequencies close to the set transmission frequency by referring to the storage unit, calculates a power value of the set transmission frequency from a linear approximation of the obtained power values, and calculates a difference between the calculated power value and the maximum transmission power defined by the communication device; and
    a multiplier that multiplies the feedback signal by the difference calculated by the correction value calculation unit.

2. The communication device according to claim 1, further comprising:
    a distortion compensation coefficient storage unit that stores the distortion compensation coefficient;
    an adjusting unit that, before the transmission signal is transmitted when the communication device is turned on, multiplies the difference calculated by the correction value calculation unit by the distortion compensation coefficient stored in the distortion compensation coefficient storage unit, and restores the distortion compensation coefficient stored in the distortion compensation coefficient storage unit by the multiplied amount after the distortion compensation coefficient stored in the distortion compensation coefficient storage unit is updated, wherein
    the multiplier multiplies the feedback signal by the difference calculated by the correction value calculation unit after the distortion compensation coefficient stored in the distortion compensation coefficient storage unit is restored by the adjusting unit.

3. The communication device according to claim 1, wherein the power values stored in the storage unit correspond to frequencies that are obtained by evenly dividing a transmission frequency band available for the communication device.

4. The communication device according to claim 1, further comprising:
    a training unit that changes a transmission signal frequency, obtains a power value of a transmission signal for each frequency, and stores the power value in the storage unit.

5. The communication device according to claim 4, wherein the power values are stored in the storage unit by the training unit before shipping the communication device.

6. A power compensation method for a communication device that compensates a distortion of a transmission signal, amplifies the compensated transmission signal by an amplifier, and outputs the amplified signal, the power compensation method comprising:

referring to a storage unit storing transmission power frequency characteristics and calculating a power value of a transmission frequency to be set, and correcting a feedback signal of the transmission signal amplified by the amplifier based on the calculated power value and a maximum power defined by the communication device; and calculating a distortion compensation coefficient based on the transmission signal and the feedback signal corrected, wherein:

the referring and correcting comprise obtaining power values corresponding to two frequencies close to the set transmission frequency by referring to the storage unit, calculating a power value of the set transmission frequency from a linear approximation of the obtained power values, calculating a difference between the calculated power value and the maximum transmission power defined by the communication device, and multiplying the feedback signal by the calculated difference.

* * * * *